(12) United States Patent
Kimmlingen et al.

(10) Patent No.: US 7,403,003 B2
(45) Date of Patent: Jul. 22, 2008

(54) ASSEMBLY FOR GENERATING MAGNETIC FIELDS IN A MAGNETIC RESONANCE TOMOGRAPHY APPARATUS THAT ALLOWS USE OF A SUPERCONDUCTING GRADIENT FIELD DEVICE

(75) Inventors: Ralph Kimmlingen, Nürnberg (DE); Andreas Krug, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/523,427

(22) Filed: Sep. 19, 2006

(65) Prior Publication Data
US 2007/0069730 A1   Mar. 29, 2007

(30) Foreign Application Priority Data
Sep. 19, 2005   (DE) .................. 10 2005 044 635

(51) Int. Cl.
G01V 3/00   (2006.01)
(52) U.S. Cl. ..................... 324/307; 324/309; 324/318
(58) Field of Classification Search ......... 324/300–322; 600/410–435
See application file for complete search history.

(56) References Cited

U.S. PATENT DOCUMENTS

| | | | |
|---|---|---|---|
| 4,652,824 A | 3/1987 | Oppelt | |
| 5,113,166 A * | 5/1992 | Miyajima et al. | 335/299 |
| 5,317,260 A * | 5/1994 | Kasten et al. | 324/309 |
| 5,661,445 A | 8/1997 | Larson, III et al. | |
| 5,708,360 A * | 1/1998 | Yui et al. | 324/318 |
| 6,507,750 B2 * | 1/2003 | Heid | 600/422 |
| 6,879,852 B1 | 4/2005 | Mueller | |
| 6,954,068 B1 * | 10/2005 | Takamori et al. | 324/318 |

FOREIGN PATENT DOCUMENTS

| | | |
|---|---|---|
| FR | 2 622 427 | 5/1989 |
| GB | 2 301 674 | 12/1996 |

* cited by examiner

Primary Examiner—Brij B. Shrivastav
Assistant Examiner—Dixomara Vargas
(74) Attorney, Agent, or Firm—Schiff Hardin LLP

(57) ABSTRACT

An assembly for magnetic field generation in a magnetic resonance tomography apparatus has a device for generation of a basic magnetic field, a vacuum vessel surrounding the basic field device and a device for generation of at least one gradient magnetic field. The assembly has a volume with a reduced magnetic field strength in a region between windings of at least one superconducting coil of the basic field device and a non-conductive wall of the vacuum vessel. The gradient field device is fashioned as a superconductor and is at least partially accommodated in this volume.

17 Claims, 3 Drawing Sheets

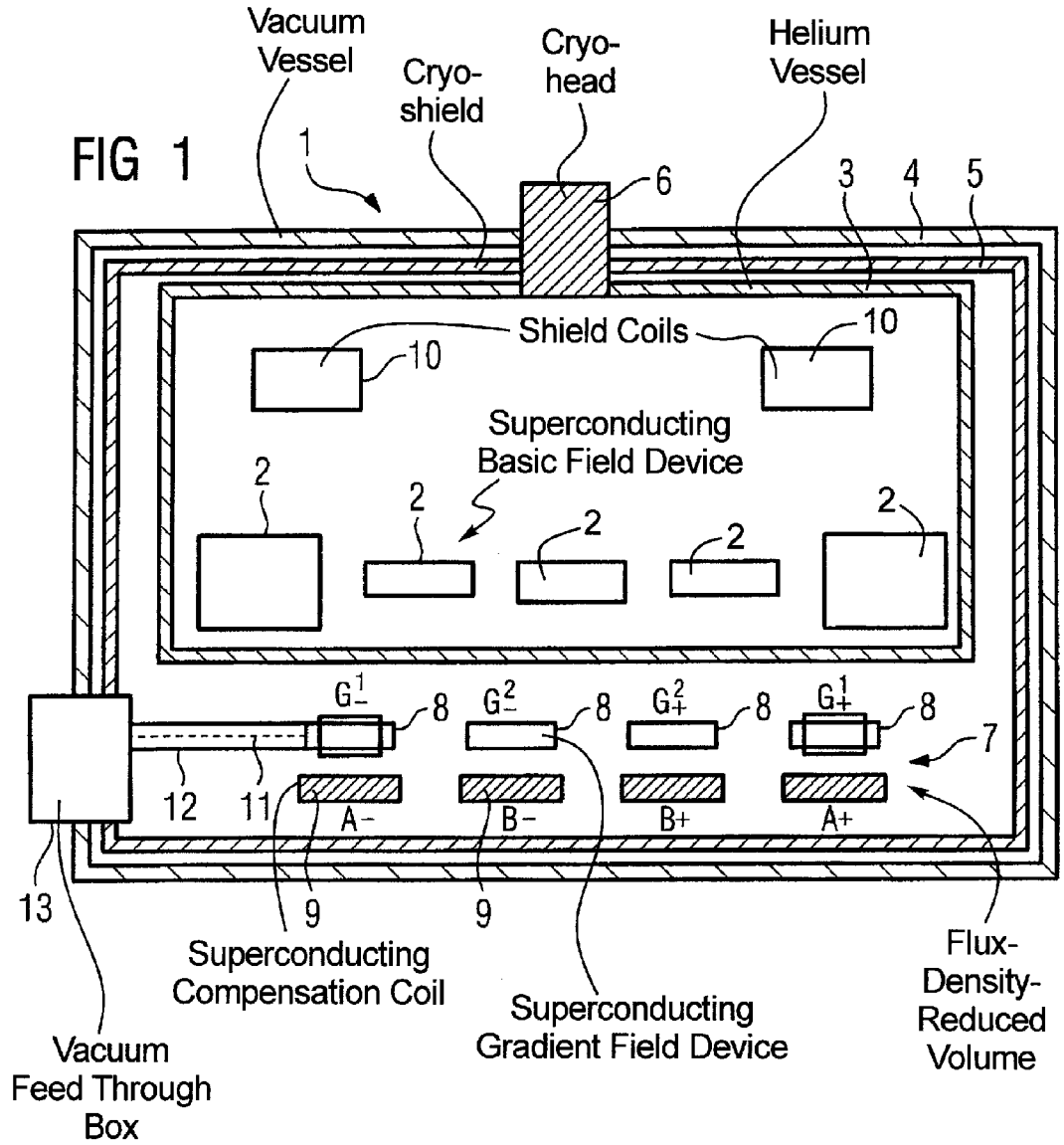
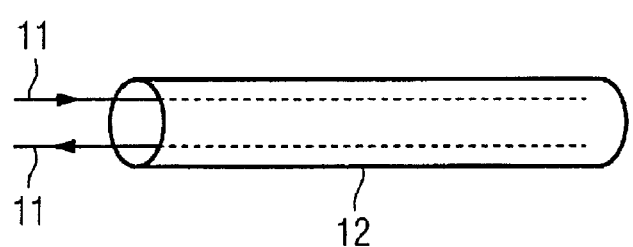

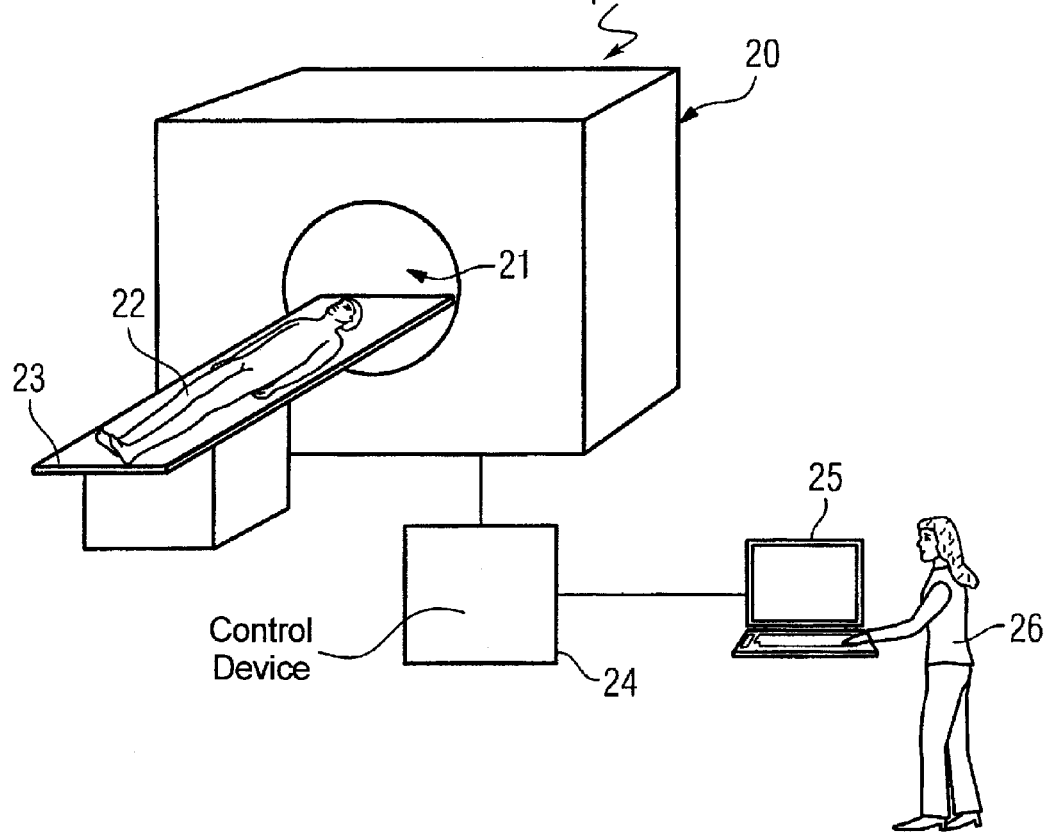

ASSEMBLY FOR GENERATING MAGNETIC FIELDS IN A MAGNETIC RESONANCE TOMOGRAPHY APPARATUS THAT ALLOWS USE OF A SUPERCONDUCTING GRADIENT FIELD DEVICE

BACKGROUND OF THE INVENTION

1. Field of the Invention

The present invention concerns an assembly for magnetic field generation in a magnetic resonance tomography apparatus including a device for generation of a basic magnetic field, a vacuum vessel surrounding the basic field device and a device for generation of at least one gradient magnetic field.

2. Description of the Prior Art

In contemporary magnetic resonance systems, the opening for acceptance of the patient bed typically exhibits a diameter of 60 cm, and the opening of the basic field magnet itself (this being the inner magnet diameter) is 90 cm. These dimensions represent a compromise for the usable and noise field magnitudes as well as with regard to the space requirement and the power requirement of the components involved in the field generation (such as the basic field magnet and the coils for generation of the gradient field).

Doctors and patients, however, prefer a greater openness of the systems. For example, from computed tomography systems it is known to make the diameter for the acceptance of the patient in the range of over 80 cm for a system longitudinal length below one meter. A larger opening for acceptance of the patient offers the advantage that the feeling of anxiety that often occurs in magnetic resonance tomography can be reduced for the patient, and thus negative influences therefrom on the image quality (for instance the patient moving due to the constricted feeling or the examination being aborted or shortened) are avoided.

Attempts have been made to enlarge the opening for acceptance of the patient bed such that newer magnetic field resonance apparatuses exhibit a system length of approximately 1.2 m with a diameter of 70 cm for acceptance of the patient. The larger radii (which are therewith disadvantageous for the field generation), cause a reduction in the usable or noise field magnitudes and/or increase the power requirement of the gradient device and of the system of radio-frequency transmission and reception coils that are normally used in spatial proximity to the gradient device since a compromise for both components must be made from the geometric requirements for an optimal field generation. The gradient strength for a system with a 70 cm-large bore is, for example, reduced maximally and nominally by 30 to 50%.

Furthermore, it has been attempted to integrate the gradient coil and a radio-frequency transmission coil into a common unit. This is possible up to a diameter of 70 cm for the patient opening, but the requirements for the material and the production are high. The power loss is additionally increased and the occurrence of disturbing excessive noises must be accepted. Given such a design the specific absorption (SAR) is more disadvantageous (primarily due to local field strength super-elevations) than in the case of a conventional concentric design.

Alternatively, the available volume for the gradient coil and an RF coil known as a body coil can be reduced in the body proximity, allowing diameters up to 70 cm to be achieved. Here as well, however, the problem arises of an increased power loss and a heightened noise generation.

SUMMARY OF THE INVENTION

An object of the present invention is to provide an assembly for magnetic field generation in a magnetic resonance tomography apparatus that avoids or minimizes the disadvantages of conventional devices of this type.

This object is achieved according to the invention by an assembly for magnetic field generation of the aforementioned type that has a volume with a reduced magnetic field strength in a region between windings of at least one superconducting coil of the basic field device and a non-conductive wall of the vacuum vessel, and a superconducting gradient field device is at least partially accommodated in this volume.

A free (open) volume region is thus achieved between the primary windings of the basic field magnet and the outer wall of a non-conductive vacuum vessel (known as an OVC (outer vacuum chamber)). This free volume region exhibits a reduced flux density that is low enough that a superconducting gradient coil can be arranged and operated in this region. In particular the flux density-reduced volume is designed such that the necessary fast switching of the gradient coil or coils is not impaired. The gradient field device is appropriately completely accommodated in this free, flux density-reduced volume. It is also possible for parts of the gradient field device that are not fashioned as superconductors to be arranged otherwise, for example as in conventional magnetic resonance systems in a region outside of the vacuum reservoir in the direction of the opening provided for the patient. However, if the superconducting gradient field device is completely arranged in the volume of reduced magnetic field strength, the size of the inner region provided for acceptance of the patient is no longer limited by gradient coils to be arranged in this region, such that diameters of 80 cm or more can be realized, and thereby a greater openness is achieved.

Such magnetic resonance systems with superconducting gradient coils have previously not been commercially available. Insofar as the use of high-temperature superconductors in connection with gradient coils was considered, it was previously unclear how these should be switched in view of the conventional arrangement of gradient coils in strong external basic magnetic fields. With the inventive apparatus for magnetic field generation, the operation of the gradient coils as high temperature superconductors is possible without problems since the switching properties are not impaired by the flux density-reduced volume.

According to the invention, the volume with reduced magnetic field strength can result for a suitable design of at least one coil of the basic field device and/or at least one additional compensation coil, in particular a superconducting compensation coil.

It is thus possible to fashion the basic field magnet from the outset in the design stage such that weak field regions result in operation that are suitable for arrangement of gradient coils. For this purpose, the appropriate requirement for achievement of the flux density-reduced volume is integrated into the target field process provided for the design of the basic field magnet, as a supplement to prior, already-existing specifications such as a field weakness to be achieved at solder points and the like.

In addition, it is possible to provide superconducting solenoid coils as compensation coils that are fashioned as high temperature superconductors operable at temperatures up to 80 K, which can be arranged near the vacuum vessel. For such compensation coils, the maximum flux density (and therewith the maximum possible winding count) depends on the temperature, such that a suitable compromise must be selected. A superconducting gradient coil generates dynamic scatter fields that propagate through the windings of the compensation coil or coils and the vacuum vessel. Opportunities for loss (such as voids and hystereses) in high temperature superconductors are additionally taken into account in the selection of the operation temperature of the compensation coil. Given available high temperature superconductors, a robust (thus quench-free) behavior results at an operating temperature of 30 K.

For fast switching capability of the currents it is necessary that the magnetic flux density of the superconductor that is used does not exceed a frequency-dependent limit value. For example, in obtainable high temperature superconductors switching frequencies up to 2 kHz are possible given a temperature of 80 K and a magnetic field of 10 mT. The occurrence of higher frequency components can be avoided with alternative control models for the gradient system. The power loss of superconducting windings is lower by a factor of 100 to 1000 in the frequency band from 0 to 2 kHz in comparison to copper windings, such that the power loss in the duty cycle is reduced from approximately 25 kW to 25-250 W.

Furthermore, a cryostat for dissipation of the power loss of the gradient field device can be provided, in particular a cryoshield and/or cryohead. The power loss from superconducting windings is clearly smaller in comparison with copper windings. The power loss of the gradient coils arising at 30 K-80 K can be dissipated at a level of 50-100 W with cryoheads available today. A cryoshield in the immediate surroundings of the gradient coil or coils serves to dissipate its losses in the range of approximately 100 W, so as to keep the temperature in a range below 80 K. A cryoshield and a cryohead are thus normally used in combination, but it is also possible to use other cryo-devices in order to dissipate the power loss of the superconductors. In particular cryostats can be used that are already provided for dissipation of the power losses of the remaining components (such as the superconducting windings of, for example, the basic field device). These cryostats are provided with a correspondingly higher capacity in order to likewise dissipate the power loss of the gradient coils that is distinctly reduced relative to conventional copper conductors.

Since the power loss of the superconducting gradient coils and the spatial requirement of the windings is smaller than in conventional arrangements, it is possible to achieve a large opening for acceptance of the patient with a small structural volume of the field-generating unit. The current density in high-temperature superconductors is thus 80 A/mm$^2$, in contrast to the previous 15 A/mm$^2$. Since the gradient field device is inventively installed within the vacuum vessel, a direct sound transmission (propagation) from the vibrating surface of the gradient coil into the inner region is no longer possible, such that a significant noise reduction results.

As already stated, the cryostat can be arranged in spatial proximity to the gradient field device, in particular on the side of the vacuum vessel facing toward the device. A cryoshield is thus appropriately arranged between the wall of the vacuum vessel that faces towards the gradient field device and the gradient field device itself, the cryoshield being arranged to keep the temperature of the superconductor below 80 K.

The volume with reduced magnetic field strength can inventively span 1 to 10 cm in the radial direction, in particular 6 cm. Such a region of 6 cm width is sufficient in order to arrange the required, actively shielded gradient coils in systems with a typical design. An inner bore for acceptance of the patient on the patient bed thus can be achieved with a diameter greater than or equal to 80 cm. Flux-reduced volumes having a thickness greater or smaller can be achieved as needed in the event that, for example, gradient coils with more windings or fewer windings are required.

The vacuum vessel is formed of a material of low electrical conductivity, an electrically non-conductive material, or non-conductive materials with regard to its cylindrical part "inside" the magnet in the direction of the patient opening. The dynamic gradient fields thus can penetrate into the imaging volume with negligibly small interactions or without interactions from the vacuum vessel.

Given the use of at least one compensation coil for the volume with reduced magnetic field strength, the compensation coil and the gradient field device can be fashioned as a modular unit. For example, a gradient layer and a compensation layer can be adapted to one another in terms of design and arrangement such that the layers basically interlock and a modular unit or a common mold results. The one or more compensation coils and gradient coils can thereby be arranged in an optimally space-saving manner. If applicable, they can already be manufactured as a unit or together with each other and/or be connected with one another, or enclosed with a composition material or the like, in order to thus form a common component.

Moreover, given the use of at least one compensation coil for the volume with reduced magnetic field strength and at least one cryostat, the compensation coil, the cryostat and the gradient field device can be fashioned as a modular unit. It is possible in practice to design the cryoshield or another cryostat in three dimensions by providing struts as cooling ribs that protrude in a further spatial direction. The modular unit so formed or a common mold of the components exhibits an increased rigidity, such that vibrations and secondary curl fields that can lead to artifacts in the imaging are minimized. Such secondary rotational fields can be induced by mechanical oscillations of the conductive structures in the basic magnetic field. By means of a slotted cryoshield or the like it is possible to shape eddy current paths (which cannot be avoided) such that the effects on the imaging volume are minimized. A cryoshield functionality, devices for static compensation field generation, and devices for the dynamic gradient field generation thus can be integrated into a common structure.

The modular unit composed of the compensation coil, cryostat and gradient field device can be fashioned as a cylindrical tube, for example with a wall strength of 70 mm (this thickness corresponds to the prior art for conventional gradient coils). Given a wall strength of 70 mm or in a similar range for such a cylindrical tube, mechanical relationships (ratios) can be achieved similar to those in conventional gradient coils insofar as forces, oscillation amplitudes and resonances.

For simplifying tempering of the superconducting properties and for minimization of connection points, the gradient field device can be fashioned at least partially from coils made from round wire (i.e. wire having a circular cross-section). The available high-temperature superconductors are either relatively brittle ceramic bands, or round wires. The use of ceramic bands allows an easy realization of the z-gradient axis to be achieved, but multiple connection points are necessary with regard to the transverse axes in order to configure the structure of, for example, a saddle coil. In comparison to this a round wire is relatively flexible in the raw state, thus before the tempering process by which superconductivity is achieved. Due to the lower current density that is required in gradient coils in comparison to the basic field magnet, one or a few layers atop one another is sufficient. The tempering process, which can be problematic given high winding and layer numbers, is thereby simpler. No problems arise due to the available wire lengths of a few 100 m for a use in gradient field devices. The costs for such a round wire material are likewise in an acceptable range.

The feed lines running inside the vacuum vessel to the gradient field device should proceed such that they generate no magnetic field that influences the generated gradient field, meaning that they should be oriented so as to be free of fields, or the conductor layout should be correspondingly selected.

For shielding or improvement of the linearity, thus generally for optimization of the field quality in the field of view, one or more field conductor structures running external to the vacuum vessel and generating fields upon being fed with current can also be provided.

The invention additionally concerns a magnetic resonance system that is fashioned with an apparatus for magnetic field generation as explained above. In a region between the primary windings of a basic field magnet and the outer wall of a non-conductive vacuum vessel, the magnetic resonance system exhibits a volume of reduced flux density in which are housed superconducting windings of a gradient field device. With regard to this space-saving arrangement of the gradient coil, an opening can be realized for acceptance of the patient on the patient bed, which opening that has a diameter of 80 cm or more. A further contributing factor to this result is that the gradient field device is fashioned as a superconductor since the superconducting windings already inherently have a smaller space requirement due to the low power loss and the higher current density.

Due to the installation of the gradient field device within the vacuum vessel, the further advantage is achieved that a direct sound transmission from the surface of the gradient coils is no longer possible, so noise development in operation of the system is significantly reduced. In view of the position of the optimized field with regard to the arrangement of the windings, the basic field magnet of the inventive magnetic resonance system has already been designed with the requirement that a flux-reduced region should be achieved for the accommodation of the gradient coils.

As an alternative or in addition, compensation coils can be provided that, for example, directly generate a field curve below the windings of the gradient coil, this field curve being designed such that the magnetic field is extinguished in the region of the superconducting gradient coil and, in the region in front of the compensation coil, becomes stronger toward the imaging volume. This can be achieved, for example, by one or more short solenoid coils. These can be arranged and operated such that the field is extinguished in the minima of the basic magnetic field and space is achieved for the z-windings of a superconducting gradient coil or segment-like transversal coils.

DESCRIPTION OF THE DRAWINGS

FIG. 1 is a section through an inventive assembly for magnetic field generation.

FIG. 2 shows the axial connections of a gradient field device of an inventive assembly for magnetic field generation.

FIG. 4 illustrates an inventive magnetic resonance system.

DESCRIPTION OF THE PREFERRED EMBODIMENTS

Figure 3A:
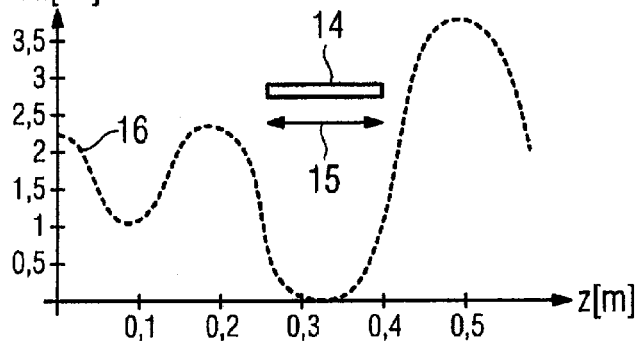
FIGS. 3A-3D illustrate the design of a volume with reduced magnetic field strength.

FIG. 1 shows a section through an inventive apparatus 1 for magnetic field generation. A longitudinal section of an upper part of such an apparatus is shown. Below this would be located an opening (not shown) for acceptance of the patient. The section drawing shown here would essentially continue mirror-inverted below the patient opening. The apparatus 1 for magnetic field generation has a basic field device 2 that is fashioned from superconducting magnet coils within a helium vessel 3. As is known, the basic magnetic field, at least in an imaging region, is static and homogenous. The helium vessel 3 is filled at liquid helium at a temperature of 4 K. For the thermal isolation (insulation) from the environment, a vacuum vessel 4 is additionally provided as an "Outer Vacuum Chamber" in which the helium vessel 3 is accommodated. A cryoshield 5 that is connected in a thermally-conductive manner with a cooling stage (level) of a cryohead 6 is arranged between the helium vessel 3 and the vacuum vessel 4. A further stage of the cryohead 6 is directly connected with the helium vessel 3 in order to ensure the constant temperature of 4 K. Embodiments with more than one radiation shield or cryoshield 5 in order to keep the temperature below 80 K are also possible.

A superconducting gradient field device 8 is arranged in a volume 7 between the basic field device 2 and the vacuum vessel 4. The gradient field device 8 has a Maxwell coil for the z-axis of the gradient coil while the transverse axes x and y are here fashioned as Golay coils. A design as segment coils is alternatively possible. The flux density-reduced volume 7 is located in the outer region of the helium vessel 3 and in the inner region of the cryoshield 5. Compensation coils (which are likewise high temperature superconductors) are provided in the direction of the opening (not shown here) for acceptance of the patient. The compensation coils 9 can be fashioned as solenoid coils and effect a minimization of the magnitude of the basic magnetic field at the position of the gradient field device 8. Moreover, shield coils 10 are provided that serve for shielding are likewise fashioned as superconductors.

A radial space with a thickness of a few cm for arrangement of the superconducting gradient field device 8 is thus provided by the flux density-reduced volume 7 in the inventive apparatus 1 for magnetic field generation. In comparison to conventional arrangements, larger openings for acceptance of the patient can be achieved with the power loss of the superconducting coils and the space requirement is additionally lower while at the same time a noise reduction can be achieved.

The axial connections of a gradient field device in an inventive apparatus for magnetic field generation are shown in FIG. 2. The conductors of the gradient field device can be subdivided into two categories, namely into the azimuthal conductors and the axial conductors. The azimuthal conductors serve for field generation. The field minimization is maintained by the solenoid coils at their position. In contrast to this, the axial conductors are connection or feed lines.

Such axial conductors 11 are shown in FIG. 2. The axial conductors 11 are directed into a high temperature superconducting cylinder 12 in order to thereby ensure the absence of a field in this region. Alternatively, guiding the axial conductors 11 in high temperature superconducting cylinder coils is possible, which is not shown here.

Given the use of high temperature superconducting cylinders (or high temperature superconducting cylinder coils) 12, only a local interference of the basic field results that can be compensated by suitably placed magnetizable materials (such as iron shims).

For connection of the gradient field device 8 of FIG. 1, the high temperature superconductor cylinders 12 with the axial conductors 11 are directed to a vacuum feedthrough box 13 at the cryoshield 5. The vacuum feedthrough box 13 provides for a cooled transition from superconducting to normally conducting. The vacuum feedthrough box 13 and the cryohead 6 can be fashioned as a unit.

An example of design of a volume with reduced magnetic field strength is shown in FIGS. 3A through 3D. The field of the basic field magnet should hereby be minimized at the position of the gradient coil conductors by means of a solenoid coil as a compensation coil. Here an already-existing basic field magnet design with a magnet with a magnetic field strength of 1.5 T was used as a starting point. However, the requirement of a field-free volume or field free zone for accommodation of the gradient field device has advantageously already been taken into account in the design of the basic field magnet. The compensation windings can be directed within a helium vessel in order to allow conventional superconductors to be used for windings. Such conventional superconductors exhibit a higher ampacity at lower costs.

The z-component of the magnetic field B is initially shown in Tesla over the z-axis in FIG. 3A. A solenoid coil 14 that is schematically shown here is hereby arranged in a minimal region of the drawn basic magnetic field. The solenoid coil 14 exhibits an axial length (indicated here by the double arrow 15) of 14 cm. This length naturally can also be of different values dependent on the actual design of the basic field magnet. The minimum of the curve 16 for the magnetic field in the z-direction for which the solenoid coil is provided lies in a range between 0.3 and 0.35 m. The solenoid current polarity sign corresponds to the polarity sign of the primary coil of the basic field magnet. The calculation was conducted for a radius of 0.445 m in the example.

Figure 3B:
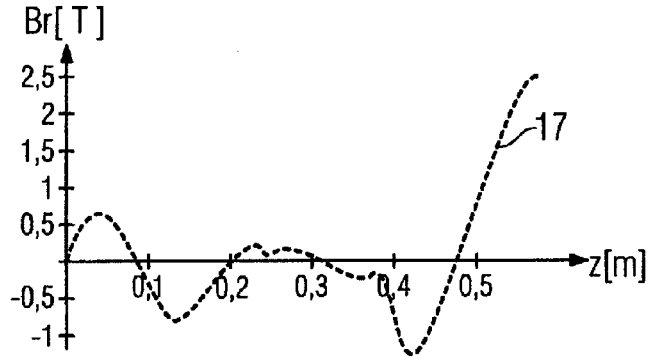
Figure 3C:
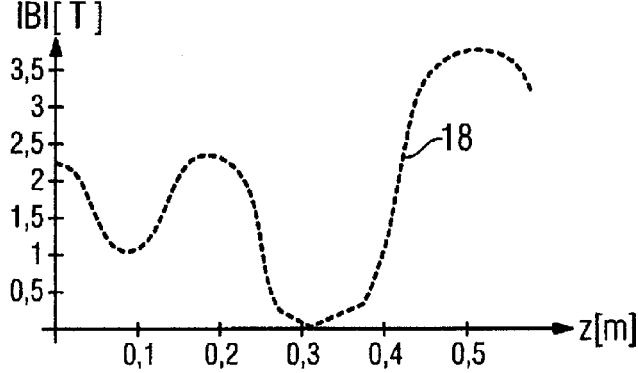
Figure 3D:
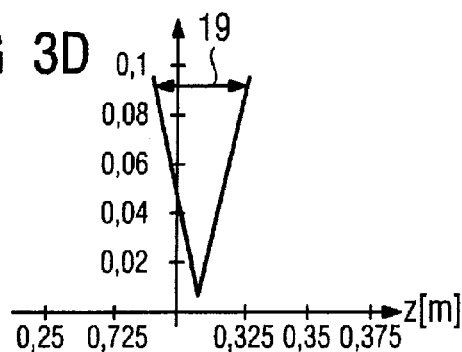

In FIG. 3B, the curve 17 of the radial component of the magnetic field is shown in Tesla over the z-axis, and thus the z-length of the solenoid coil 14. The region of a minimal field (shown in FIG. 3C) corresponding to the magnitude curve 18 results as a result [sic]. In the region of the minimal field the magnitude of the same lies below 100 mT, with this region (which is shown enlarged in FIG. 3D) exhibits a width of approximately 5 cm over the z-axis, which width is represented here by the double arrow 19. This region in which the basic magnetic field is virtually obliterated is then available for the z-windings of a superconducting gradient coil or, respectively, segment-like transversal coils.

Analogously, given the use of other compensation coils or other specifications with regard to the basic field magnet, a flux-reduced volume or a number of flux-reduced volumes are likewise generated in a region between the windings of a basic field magnet and a surrounding vacuum vessel, in which flux-reduced volume or a number of flux-reduced volumes the individual coils of a gradient field device can be accommodated.

An inventive magnetic resonance system is shown in FIG. 4, which has a magnetic resonance data acquisition device 20 with a patient opening 21 for acceptance of a patient 22 on a patient bed 23 that exhibits a diameter of over 80 cm.

A control device 24 is additionally shown in connection with an output and input unit 25 for an operator 26, via which control of the magnetic resonance system 20 for data acquisition is enabled.

The large diameter of the opening 21 for acceptance of the patient is achieved by the gradient coils (not shown here) being fashioned as superconductors and being arranged between the windings of the basic field magnet and an outer vacuum vessel in a flux-reduced volume using an apparatus as illustrated in the preceding for magnetic field generation. The gradient coils, thus are arranged in one or more regions of reduced magnetic field strength. In the inventive magnetic resonance system 21, the examination by the operator 26 thus can be designed more comfortably for the operator 26 and for the patient 22. The problem of a constricted feeling in openings with small diameters can be avoided, and a high image quality thus can simultaneously be ensured.

Although modifications and changes may be suggested by those skilled in the art, it is the intention of the inventors to embody within the patent warranted hereon all changes and modifications as reasonably and properly come within the scope of their contribution to the art.

We claim as our invention:

1. An assembly for magnetic field generation in a magnetic resonance tomography apparatus comprising:
    a superconducting magnet device that generates a basic magnetic field, said superconducting magnetic device comprising a superconducting coil having a plurality of windings;
    a vacuum vessel that surrounds said superconducting magnet device, said vacuum vessel having a non-conductive wall;
    a superconducting gradient field device operable, if not in a magnetic field above an impairing magnetic field strength, to generate a rapidly switched gradient field; and
    said non-conductive wall of said vacuum vessel forming, in combination with said superconducting coil, a region between windings of said superconducting coil in which said superconducting gradient field device is disposed, and a magnetic field source that produces a reduced magnetic field in said region having a magnetic field strength below said impairing field strength to allow said operation of said superconducting gradient field device to generate said rapidly switched gradient fields.

2. An assembly as claimed in claim 1 wherein said magnetic field source comprises said superconducting coil.

3. An assembly as claimed in claim 1 wherein said magnetic field source comprises a compensation coil that generates a compensation magnetic field that, in combination with said basic magnetic field, produces said reduced magnetic field in said region.

4. An assembly as claimed in claim 3 wherein said compensation coil is a superconducting compensation coil.

5. An assembly as claimed in claim 4 wherein said superconducting compensation coil and said superconducting gradient field device are combined as a unitary modular unit.

6. An assembly as claimed in claim 4 comprising a cryostat that interacts with said superconducting gradient field device to dissipate power lost from said superconducting gradient field device, and wherein said superconducting compensation coil, said superconducting gradient field device and said cryostat are combined as a single, unitary modular unit.

7. An assembly as claimed in claim 6 wherein said modular unit is a cylindrical tube having a tube wall thickness of approximately 70 mm.

8. An assembly as claimed in claim 1 wherein said superconducting gradient coil device is operable to produce said switched gradient fields at a frequency, and wherein said superconducting coil of said superconducting device that generates said basic magnetic field comprises said magnetic field source and generates said reduced magnetic field with a flux density that does not exceed a limit that is dependent on said frequency.

9. An assembly as claimed in claim 1 comprising a cryostat that interacts with said superconducting gradient field device to dissipate power lost from said superconducting gradient field device during said operation of said superconducting gradient field device.

10. An assembly as claimed in claim 9 wherein said cryostat is selected from the group consisting of cryoshields and cryoheads.

11. An assembly as claimed in claim 9 wherein said vacuum vessel has a side facing toward said superconducting gradient field device, and wherein said cryostat is disposed at said side of said vacuum vessel.

12. An assembly as claimed in claim 1 wherein said assembly has a longitudinal axis, and wherein said volume with reduced magnetic field strength spans a length between 1 cm to 10 cm in a radial direction relative to said longitudinal axis.

13. An assembly as claimed in claim 12 wherein said volume, in which said magnetic field is generated by said magnetic field source, with said reduced magnetic field strength spans a length of 6 cm in said radial direction relative to said longitudinal axis.

14. An assembly as claimed in claim 1 wherein said superconducting gradient field device comprises gradient field coils consisting of wire having a circular cross-section.

15. An assembly as claimed in claim 1 wherein said vacuum vessel contains conductors connected to said superconducting gradient field device, and wherein said conductors are oriented to generate substantially no magnetic field that influences said gradient field.

16. An assembly as claimed in claim 1 comprising at least one field-generating conductor structure disposed externally of said vacuum vessel.

17. A magnetic resonance imaging system comprising:
a magnetic resonance data acquisition device configured to interact with an examination subject, said magnetic resonance data acquisition device having an assembly comprising a superconducting magnet device that generates a basic magnetic field, said superconducting magnetic device comprising a superconducting coil having a plurality of windings, a vacuum vessel that surrounds said superconducting magnet device, said vacuum vessel having a non-conductive wall, a superconducting gradient field device, if not in a magnetic field above an impairing magnetic field strength, operable to generate a rapidly switched gradient field, and said non-conductive wall of said vacuum vessel forming, in combination with said superconducting coil, a region between windings of said superconducting coil in which said superconducting gradient field device is disposed, and a magnetic field source that produces a reduced magnetic field in said region having a magnetic field strength below said impairing field strength to allow said operation of said superconducting gradient field device to generate said rapidly switched gradient fields; and
a control unit that operates said superconducting gradient field device to generate said rapidly switched gradient field.

* * * * *